United States Patent
Matero

(10) Patent No.: US 9,929,009 B2
(45) Date of Patent: Mar. 27, 2018

(54) CYCLICAL DEPOSITION OF GERMANIUM

(71) Applicant: ASM IP HOLDING B.V., Almere (NL)

(72) Inventor: Raija H. Matero, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/435,769

(22) Filed: Feb. 17, 2017

(65) Prior Publication Data

US 2018/0005823 A1    Jan. 4, 2018

Related U.S. Application Data

(63) Continuation of application No. 14/969,413, filed on Dec. 15, 2015, now Pat. No. 9,576,794, which is a continuation of application No. 14/135,383, filed on Dec. 19, 2013, now Pat. No. 9,218,963.

(51) Int. Cl.
| | |
|---|---|
| *H01L 21/02* | (2006.01) |
| *C23C 16/455* | (2006.01) |
| *C23C 16/28* | (2006.01) |
| *H01L 29/66* | (2006.01) |

(52) U.S. Cl.
CPC ........ *H01L 21/02532* (2013.01); *C23C 16/28* (2013.01); *C23C 16/45525* (2013.01); *H01L 21/0262* (2013.01); *H01L 29/66795* (2013.01)

(58) Field of Classification Search
CPC ................ H01L 21/02532; H01L 21/0262
See application file for complete search history.

(56) References Cited

U.S. PATENT DOCUMENTS

| | | | |
|---|---|---|---|
| 4,363,828 | A | 12/1982 | Brodsky et al. |
| 5,221,413 | A | 6/1993 | Brasen et al. |
| 5,221,556 | A | 6/1993 | Hawkins et al. |
| 5,256,550 | A | 10/1993 | Laderman et al. |
| 5,259,918 | A | 11/1993 | Akbar et al. |
| 5,308,788 | A | 5/1994 | Fitch et al. |

(Continued)

FOREIGN PATENT DOCUMENTS

| | | |
|---|---|---|
| EP | 0858101 | 8/1998 |
| EP | 1 681 711 | 7/2006 |

(Continued)

OTHER PUBLICATIONS

"Physics of Thin Films", printed from http://www.uccs.edu/~tchriste/courses/PHYS549/549lectures/film2.html(Feb. 22, 2000).

(Continued)

*Primary Examiner* — Karen Kusumakar
(74) *Attorney, Agent, or Firm* — Knobbe, Martens, Olson & Bear LLP

(57) ABSTRACT

In some aspects, methods for forming a germanium thin film using a cyclical deposition process are provided. In some embodiments, the germanium thin film is formed on a substrate in a reaction chamber, and the process includes one or more deposition cycles of alternately and sequentially contacting the substrate with a vapor phase germanium precursor and a nitrogen reactant. In some embodiments, the process is repeated until a germanium thin film of desired thickness has been formed.

20 Claims, 3 Drawing Sheets

(56) References Cited

U.S. PATENT DOCUMENTS

| | | |
|---|---|---|
| 5,442,205 A | 8/1995 | Brasen et al. |
| 5,445,897 A | 8/1995 | Satoh et al. |
| 5,633,516 A | 5/1997 | Mishima et al. |
| 5,766,999 A | 6/1998 | Sato et al. |
| 5,847,409 A | 12/1998 | Nakayama |
| 5,879,970 A | 3/1999 | Shiota et al. |
| 5,891,769 A | 4/1999 | Liaw et al. |
| 6,030,894 A | 2/2000 | Hada et al. |
| 6,093,252 A | 7/2000 | Wengert et al. |
| 6,107,653 A | 8/2000 | Fitzgerald |
| 6,154,475 A | 11/2000 | Soref et al. |
| 6,235,568 B1 | 5/2001 | Murthy et al. |
| 6,319,782 B1 | 11/2001 | Nakabayashi |
| 6,346,732 B1 | 2/2002 | Mizushima et al. |
| 6,350,993 B1 | 2/2002 | Chu et al. |
| 6,373,112 B1 | 4/2002 | Murthy et al. |
| 6,395,621 B1 | 5/2002 | Mizushima et al. |
| 6,411,548 B1 | 6/2002 | Sakui et al. |
| 6,425,951 B1 | 7/2002 | Chu et al. |
| 6,429,098 B1 | 8/2002 | Bensahel et al. |
| 6,455,871 B1 | 9/2002 | Shim et al. |
| 6,461,945 B1 | 10/2002 | Yu |
| 6,464,780 B1 | 10/2002 | Mantl et al. |
| 6,475,865 B1 | 11/2002 | Yang et al. |
| 6,482,705 B1 | 11/2002 | Yu |
| 6,525,338 B2 | 2/2003 | Mizushima et al. |
| 6,537,370 B1 | 3/2003 | Hernandez et al. |
| 6,555,839 B2 | 4/2003 | Fitzgerald |
| 6,562,736 B2 | 5/2003 | Yanagawa et al. |
| 6,573,126 B2 | 6/2003 | Cheng et al. |
| 6,592,942 B1 | 7/2003 | Van Wijck |
| 6,620,743 B2 | 9/2003 | Pagliaro, Jr. et al. |
| 6,633,066 B1 | 10/2003 | Bae et al. |
| 6,635,110 B1 | 10/2003 | Luan et al. |
| 6,645,836 B2 | 11/2003 | Kanzawa et al. |
| 6,649,980 B2 | 11/2003 | Noguchi |
| 6,713,326 B2 | 3/2004 | Cheng et al. |
| 6,723,622 B2 | 4/2004 | Murthy et al. |
| 6,749,687 B1 | 6/2004 | Ferro et al. |
| 6,770,134 B2 | 8/2004 | Maydan et al. |
| 6,812,495 B2 | 11/2004 | Wada et al. |
| 6,821,825 B2 | 11/2004 | Todd |
| 6,830,964 B1 | 12/2004 | Mears et al. |
| 6,833,294 B1 | 12/2004 | Mears et al. |
| 6,844,213 B2 | 1/2005 | Sparks |
| 6,855,649 B2 | 2/2005 | Christiansen et al. |
| 6,858,502 B2 | 2/2005 | Chu et al. |
| 6,864,520 B2 | 3/2005 | Fischetti et al. |
| 6,875,279 B2 | 4/2005 | Chu et al. |
| 6,887,773 B2 | 5/2005 | Gunn, III |
| 6,900,115 B2 | 5/2005 | Todd |
| 6,905,972 B2 | 6/2005 | Oda |
| 6,953,736 B2 | 10/2005 | Ghyselen et al. |
| 6,958,253 B2 | 10/2005 | Todd |
| 6,960,537 B2 | 11/2005 | Shero et al. |
| 6,995,076 B2 | 2/2006 | Wang et al. |
| 7,022,593 B2 | 4/2006 | Arena et al. |
| 7,026,219 B2 | 4/2006 | Pomarede et al. |
| 7,037,856 B1 | 5/2006 | Maa et al. |
| 7,049,627 B2 | 5/2006 | Vineis et al. |
| 7,108,748 B2 | 9/2006 | Brabant et al. |
| 7,115,521 B2 | 10/2006 | Brabant et al. |
| 7,132,338 B2 | 11/2006 | Samoilov et al. |
| 7,232,487 B2 | 6/2007 | Silver et al. |
| 7,238,595 B2 | 7/2007 | Brabant et al. |
| 7,312,165 B2 | 12/2007 | Jursich et al. |
| 7,329,593 B2 | 2/2008 | Bauer et al. |
| 7,357,838 B2 | 4/2008 | Lin et al. |
| 7,387,953 B2 | 6/2008 | Figuet |
| 7,390,725 B2 | 6/2008 | Maa et al. |
| 7,402,504 B2 | 7/2008 | Brabant et al. |
| 7,452,757 B2 | 11/2008 | Werkhoven et al. |
| 7,479,443 B2 | 1/2009 | Bauer |
| 7,608,526 B2 | 10/2009 | Cody et al. |
| 7,682,947 B2 | 3/2010 | Brabant et al. |
| 7,772,127 B2 | 8/2010 | Figuet et al. |
| 7,785,995 B2 | 8/2010 | Cody et al. |
| 7,825,401 B2 | 11/2010 | Cody et al. |
| 7,901,968 B2 | 3/2011 | Weeks et al. |
| 2002/0034864 A1 | 3/2002 | Mizushima et al. |
| 2002/0173104 A1 | 11/2002 | Chang |
| 2002/0173130 A1 | 11/2002 | Pomerede et al. |
| 2003/0036268 A1 | 2/2003 | Brabant et al. |
| 2003/0045063 A1 | 3/2003 | Oda |
| 2003/0080394 A1 | 5/2003 | Babcock et al. |
| 2003/0082300 A1 | 5/2003 | Todd et al. |
| 2003/0124818 A1 | 7/2003 | Luo et al. |
| 2003/0139000 A1* | 7/2003 | Bedell .............. H01L 21/02378 438/186 |
| 2003/0143783 A1 | 7/2003 | Maa et al. |
| 2003/0153161 A1 | 8/2003 | Chu et al. |
| 2003/0157787 A1 | 8/2003 | Murthy et al. |
| 2003/0162348 A1 | 8/2003 | Yeo et al. |
| 2003/0190791 A1 | 10/2003 | Fischetti et al. |
| 2003/0207127 A1 | 11/2003 | Murthy et al. |
| 2003/0230233 A1 | 12/2003 | Fitzgerald et al. |
| 2003/0235931 A1 | 12/2003 | Wada et al. |
| 2004/0075105 A1 | 4/2004 | Leitz et al. |
| 2004/0087117 A1 | 5/2004 | Leitz et al. |
| 2004/0097022 A1 | 5/2004 | Werkhoven et al. |
| 2004/0137167 A1 | 7/2004 | Nguyen |
| 2004/0151845 A1 | 8/2004 | Nguyen et al. |
| 2004/0157409 A1 | 8/2004 | Ghyselen et al. |
| 2004/0178406 A1 | 9/2004 | Chu |
| 2004/0192002 A1 | 9/2004 | Soman et al. |
| 2004/0197945 A1* | 10/2004 | Woelk .................. C07F 7/0807 438/99 |
| 2004/0217845 A1 | 11/2004 | Silver et al. |
| 2004/0219735 A1 | 11/2004 | Brabant et al. |
| 2005/0051795 A1 | 3/2005 | Arena et al. |
| 2005/0054175 A1 | 3/2005 | Bauer |
| 2005/0067377 A1 | 3/2005 | Lei et al. |
| 2005/0079692 A1 | 4/2005 | Samoilov et al. |
| 2005/0081787 A1* | 4/2005 | Im ..................... C23C 16/45544 118/715 |
| 2005/0150447 A1 | 7/2005 | Ghyselen et al. |
| 2005/0170577 A1 | 8/2005 | Yao et al. |
| 2005/0191826 A1 | 9/2005 | Bauer et al. |
| 2005/0192193 A1 | 9/2005 | Korzenski et al. |
| 2005/0266700 A1 | 12/2005 | Jursich et al. |
| 2005/0277260 A1 | 12/2005 | Cohen et al. |
| 2006/0057825 A1 | 3/2006 | Bude et al. |
| 2006/0138393 A1 | 6/2006 | Seo et al. |
| 2006/0145188 A1 | 7/2006 | Dantz et al. |
| 2006/0199357 A1 | 9/2006 | Wan et al. |
| 2006/0211230 A1 | 9/2006 | Figuet |
| 2006/0216417 A1 | 9/2006 | Todd et al. |
| 2007/0044706 A1 | 3/2007 | Kang et al. |
| 2007/0048956 A1 | 3/2007 | Dip et al. |
| 2007/0051975 A1 | 3/2007 | Figuet et al. |
| 2007/0117335 A1 | 5/2007 | Sandhu et al. |
| 2007/0117398 A1 | 5/2007 | Okada et al. |
| 2007/0134886 A1 | 6/2007 | Quevedo-Lopez et al. |
| 2007/0155138 A1 | 7/2007 | Tomasini et al. |
| 2007/0264801 A1 | 11/2007 | Cody et al. |
| 2008/0017952 A1 | 1/2008 | Cody et al. |
| 2009/0072271 A1* | 3/2009 | Gomez ............ H01L 21/02381 257/190 |
| 2009/0203197 A1 | 8/2009 | Hanawa et al. |
| 2009/0305458 A1 | 12/2009 | Hunks et al. |
| 2010/0006024 A1 | 1/2010 | Brabant et al. |
| 2011/0117732 A1 | 5/2011 | Bauer et al. |
| 2011/0262660 A1 | 10/2011 | Ishii et al. |
| 2012/0009802 A1 | 1/2012 | LaVoie et al. |
| 2012/0028410 A1 | 2/2012 | Marsh |
| 2012/0028454 A1 | 2/2012 | Swaminathan et al. |
| 2012/0231611 A1 | 9/2012 | Gatineau et al. |
| 2012/0244688 A1 | 9/2012 | Bauer et al. |
| 2012/0247386 A1* | 10/2012 | Sanchez ................ C30B 25/14 117/99 |
| 2013/0045374 A1 | 2/2013 | Yu et al. |
| 2013/0210217 A1 | 8/2013 | Xiao |

(56) References Cited

U.S. PATENT DOCUMENTS

| | | | |
|---|---|---|---|
| 2013/0233240 | A1 | 9/2013 | Cody et al. |
| 2014/0065841 | A1 | 3/2014 | Matero |
| 2014/0120738 | A1 | 5/2014 | Jung et al. |

FOREIGN PATENT DOCUMENTS

| | | |
|---|---|---|
| JP | 04-245419 | 9/1992 |
| JP | H07-037823 | 2/1995 |
| JP | 10-256169 | 9/1998 |
| JP | 2000-021783 | 1/2000 |
| JP | 2000-286413 | 10/2000 |
| JP | 2002-525255 | 8/2002 |
| JP | 2002-539613 | 11/2002 |
| JP | 2003-023146 | 1/2003 |
| JP | 2004-179452 | 6/2004 |
| JP | 2005-518093 | 5/2005 |
| JP | 2005-536876 | 12/2005 |
| JP | 2006-191112 | 7/2006 |
| WO | WO 00/15885 | 3/2000 |
| WO | WO 2000/54338 | 9/2000 |
| WO | WO 01/41544 | 6/2001 |
| WO | WO 02/097864 | 12/2002 |
| WO | WO 03/069658 | 8/2003 |
| WO | WO 2011027321 | 3/2011 |

OTHER PUBLICATIONS

Bauer et al., "Crystalline to Amorphous Phase Transition in Very Low Temperature Molecular Beam Epitaxy", Materials Science and Engineering B89:263-268 (2002).
Bauer et al., "High Ge content photodetectors on thin SiGe buffers", Materials Science and Engineering B89:77-83 (2002).
Bauer et al., "Relaxed SiGe buffers with thicknesses below 0.1 µm", Thin Solid Films 369:152-156 (2000).
Bensahel et al., "Single-wafer processing of in-situ doped polycrystalline Si and $Si_{1-x}Ge_x$", Solid State Technology, pp. S5-S10 (Mar. 1998).
Bolkhovityanov et al., "Artificial GeSi Substrates for Heteroepitaxy: Achievements and Problems," Semiconductors 37(5): 493-518 (2003).
Cannon, D. et al., "Tensile strained epitaxial Ge films on Si(100) substrates with potential application in L-band telecommunications," Applied Physics Letters, vol. 84, No. 6, Feb. 9, 2004, pp. 906-908.
Christiansen et al., "Strain Relaxation Mechanisms in He+-Implanted and Annealed Si1—xGex Layers on Si(001) Substrates", Material Research Society Symposium Proceedings 686:A1.6.1-A1.6.6 (2002).
Chui et al., "Ultrathin high-k gate dielectric technology for germanium MOS applications", IEEE 60th Annual Device Research Conference (DRC) Digest, paper VII.B2, pp. 191-192 (2002).
Colace et al., "Ge/Si(001) photodetector for near infrared light", Solid State Phenomena 54:55-58 (1997).
Colace et al., "Metal-Ge—Si diodes for near-infrared light detection", Journal of Vacuum Science and Technology B 17:465 (1999).
Colace et al., "Metal—semiconductor-metal near-infrared light detector based on epitaxial Ge/Si", Applied Physics Letters 72:3175-3177 (1998).
Colace, L. et al., "Efficient high-speed near-infrared Ge photodetectors integrated on Si substrates," Applied Physics Letters, vol. 76, No. 10, Mar. 6, 2000, pp. 1231-1233.
Colace, L. et al., "Ge-on-Si Approaches to the Detection of Near-Infrared Light," IEEE Journal of Quantum Electronics, vol. 35, No. 12, Dec. 1999, pp. 1843-1852.
Currie et al., "Controlling threading dislocation densities in Ge on Si using graded SiGe layers and chemical-mechanical polishing", Applied Physics Letters 72:1718-1720 (1998).
Delhougne et al., "Development of a New Type of SiGe Thin Strain Relaxed Buffer Based on the Incorporation of a Carbon-Containing Layer", Applied Surface Science 224:91-94 (2004).

Fama, S. et al.,"High performance germanium-on-silicon detectors for optical communications," Applied Physics Letters, vol. 81, No. 4, Jul. 22, 2002, pp. 586-588.
File History printed May 23, 2012 for U.S. Appl. No. 10/800,390, filed Mar. 12, 2004, entitled "Epitaxial Semiconductor Deposition Methods and Structures".
File History printed May 23, 2012 for U.S. Appl. No. 10/993,024, filed Nov. 18, 2004, entitled "Epitaxial Semiconductor Deposition Methods and Structures".
File History printed May 23, 2012 for U.S. Appl. No. 11/506,320, filed Aug. 18, 2006, entitled "Epitaxial Semiconductor Deposition Methods and Structures".
File History printed May 23, 2012 for U.S. Appl. No. 11/755,528, filed May 30, 2007, entitled "Epitaxial Semiconductor Deposition Methods and Structures".
File History printed May 23, 2012 for U.S. Appl. No. 12/556,377, filed Sep. 9, 2009, entitled "Epitaxial Semiconductor Deposition Methods and Structures".
File History printed May 23, 2012 for U.S. Appl. No. 11/067,307, filed Feb. 25, 2005, entitled "Germanium Deposition".
File History printed May 23, 2012 for U.S. Appl. No. 11/867,318, filed Oct. 4, 2007, entitled "Germanium Deposition".
File History printed May 23, 2012 for U.S. Appl. No. 11/388,313, filed Mar. 23, 2006, entitled "Heteroepitaxial Deposition Over an Oxidized Surface".
File History printed May 23, 2012 for U.S. Appl. No. 11/431,336, filed May 9, 2006, entitled "Semiconductor Buffer Structures".
File History printed May 23, 2012 for U.S. Appl. No. 11/491,616, filed Jul. 24, 2006, entitled "Strained Layers Within Semiconductor Buffer Structures".
File History printed May 23, 2012 for U.S. Appl. No. 12/562,029, filed Sep. 17, 2009, entitled "Strained Layers Within Semiconductor Buffer Structures".
Fischetti et al., "Band structure, deformation potentials, and carrier mobility in strained Si, Ge, and SiGe alloys", Journal of Applied Physics 80:2234-2252 (1996).
Fitzgerald et al., "Totally Relaxed $Ge_xSi_{1-x}$ Layers with Low Threading Dislocation Densities Grown on Si Substrates," Appl. Phys. Lett. 59(7): 811-813 (1991).
Giovane et al., "Correlation between leakage current density and threading dislocation density in SiGe p-i-n diodes grown on relaxed graded buffer layers", Applied Physics Letters 78:541-543 (2001).
Hackbarth et al., "Alternatives to Thick MBE-Grown Relaxed SiGe Buffers", Thin Solid Films 369:148-151 (2000).
Hartmann et al., "Reduced pressure—chemical vapor deposition of Ge thick layers on Si(001) for 1.3-1.55-µm photodetection", Journal of Applied Physics 95:5905-5913 (2004).
Haynes et al., "Composition Dependence of Solid-Phase Epitaxy in Silicon-Germanium Alloys: Experiment and Theory", Physical Review B 51:7762-7771 (1995).
Herzog et al., "Si/SiGe n-MODFETs on Thin SiGe Virtual Substrates Prepared by Means of He Implantation", IEEE Electron Device Letters, 23:485-487 (2002).
Huang et al., "Electron and Hole Mobility Enhancement in Strained SOI by Wafer Bonding", IEEE Transactions on Electron Devices 49:1566-1571 (2002).
Huang et al., "SiGe-on-Insulator Prepared by Wafer Bonding and Layer Transfer for High-Performance Field-Effect Transistors", Applied Physics Letters 78:1267-1269 (2001).
Hull, R., "Metastable strained layer configurations in the SiGe/Si system," (1999) EMIS Datareviews, Series No. 24: Properties of SiGe and SiGe:C, edited by Erich Kasper et al., INSPEC (2000), London, UK.
International Preliminary Report on Patentability for International Application No. PCT/US2007/072252, dated Nov. 3, 2008.
International Preliminary Report on Patentability for PCT/US2007/008879 dated Nov. 20, 2008.
International Search Report and Written Opinion for PCT Application No. PCT/US2007/072252 dated Dec. 19, 2007.
International Search Report for International Application No. PCT/US04/07564 dated Apr. 6, 2005.
International Search Report for PCT/US05/06150 dated Jun. 19, 2008.

(56) References Cited

OTHER PUBLICATIONS

Isella et al., "Low-energy plasma-enhanced chemical vapor deposition for strained Si and Ge heterostructures and devices" Solid State Electronics, Elsevier Science Publishers, Barking, GB, vol. 48, No. 8, Aug. 2004 (Aug. 2004), pp. 1317-1323.
Ishikawa et al., "Strain-induced band gap shrinkage in Ge grown on Si substrate," Applied Physics Letters, vol. 82, No. 12, Mar. 31, 2003, pp. 2044-2046.
Jackson et al., "Gate-Self-Aligned p-Channel Germanium MISFET's", *IEEE Electron Device Letters* 12:605-607 (1991).
Kamins et al., "Deposition of Three-Dimensional Germanium Islands on Si(001) by Chemical Vapor Deposition at Atmospheric and Reduced Pressures", J. Appl. Phys. 81:211-219 (1997).
Kasper et al., "New virtual substrate concept for vertical MOS transistors", *Thin Solid Films* 336:319-322 (1998).
Kasper, "Prospects of SiGe Heterodevices", *Journal of Crystal Growth* 150:921-925 (1995).
Kutsukake et al., "Fabrication of SiGe-On-Insulator through Thermal Diffusion on Germanium on Si-on-Insulator Substrate", Jpn. J. Appl. Phys. 42:L232-L234 (2003).
Langdo et al., "High quality Ge on Si by epitaxial necking", Applied Physics Letter, vol. 76, No. 25, pp. 3700-3702, Jun. 19, 2000.
Lee et al., "Electron mobility characteristics of n-channel metal-oxide-semiconductor field-effect transistors fabricated on Ge-rich single- and dual-channel SiGe heterostructures", *Journal of Applied Physics* 95:1550-1555 (2004).
Lee et al., "Growth of strained Si and strained Ge heterostructures on relaxed $Si_{1-x}Ge_x$ by ultrahigh vacuum chemical vapor deposition," J. Vac. Sci. Technol. B 22(1) (Jan./Feb. 2004).
Lee et al., "Strained Ge channel p-type metal-oxide-semiconductor field-effect transistors grown on $Si_{1-x}Ge_x$/Si virtual substrates", *Applied Physics Letters* 79:3344-3346 (2001).
Lee et al., "Strained Si/strained Ge dual-channel heterostructures on Relaxed $Si_{0.5}Ge_{0.5}$ for symmetric mobility p-type and n-type metal-oxide-semiconductor field-effect transistors", *Applied Physics Letters* 83:4202-4204 (2003).
Letertre et al., "Germanium-on-insulator (GeOI) structure realized by the Smart Cut™ technology", *MRS Proceedings*, vol. 809 (2004).
Levinstein, Michael E., Rumyantsev, Sergey L, and Michael Shur S., *Properties of Advanced Semiconductor Materials GaN, AlN, InN, BN, SiC, SiGe*, John Wiley & Sons, Inc., 149-187 (2001).
Li, Q, et al., "Selective growth of Ge on Si(100) through vias of $SiO_2$ nanotemplate using solid source molecular beam epitaxy," Applied Physics Letters, vol. 83, No. 24, Dec. 15, 2003, pp. 5032-5034.
Liszkay et al., "Strain Relaxation Induced by He-Implantation at the Si¬¬ 1-xGex/Si(100) Interface Investigated by Positron Annihilation", Applied Surface Science 194:136-139 (2002).
Liu, J. et al., "Silicidation-induced band gap shrinkage in Ge epitaxial films on Si," Applied Physics Letters, vol. 84, No. 5, Feb. 2, 2004, pp. 660-662.
Luan et al., "High-quality Ge epilayers on Si with low threading-dislocation densities", *Applied Physics Letters* 75:2909-2911 (1999).
Luysberg et al., "Effect of Helium Ion Implantation and Annealing on the Relaxation Behavior of Pseudomorphic Si1—xGex Buffer Layers on Si(100) Substrates", Journal of Applied Physics 92:4290-4295 (2002).
Lyutovich et al., "Interaction between point defects and dislocations in SiGe", *Solid State Phenomena* 69-70:179-184 (1999).
Lyutovich et al., "Relaxed SiGe buffer layer growth with point defect injection", *Materials Science and Engineering* B71:14-19 (2000).
Lyutovich et al., "Thin SiGe buffers with high Ge content for n-MOSFETs", *Materials Science and Engineering* B89:341-345 (2002).

Masini, G. et al.; "High-Performance p-i-n Ge on Si Photodetectors for the Near Infrared: From Model to Demonstration," IEEE Transactions of Electron Devices, vol. 48, No. 6, Jun. 2001, pp. 1092-1096.
Medeiros-Ribeiro et al., "Equilibrium Size Distributions of Clusters During Strained Epitaxial Growth", Materials Science and Engineering B67:31-38 (1999).
Nakamura et al., "InGaN/GaN/AlGaN-Based Laser Diodes with Modulation-Doped Strained-Layer Superlattices", Jap. J. Appl. Phys., vol. 36, No. 12A, Part 2, p. L1568-L1571 (1997).
Nam et al., "Lateral epitaxy of low defect density GaN layers via organometallic vapor phase epitaxy", Phys. Lett, vol. 71, No. 18, p. 2638 (1997).
Ni et al., "X-ray reciprocal space mapping studies of strain relaxation in thin SiGe layers (≤100 nm) using a low temperature growth step", *Journal of Crystal Growth* 227-228:756-760 (2001).
Obata et al., "Structural Characterization of $Si_{0.7}Ge_{0.3}$ Layers Grown on Si(001) Substrates by Molecular Beam Epitaxy," *J. Appl. Phys.* 81(1): 199-204 (1997).
Osten et al., "Relaxed Si1—xGex—Si1-x-yGexCy Buffer Structures with Low Threading Dislocation Density", Applied Physics Letters 70:2813-2815 (1997).
Pending U.S. Appl. No. 11/267,494 entitled: Semiconductor Heterostructure and Method for Forming a Semiconductor Heterostructure, filed Mar. 11, 2005 by Christophe Figuet and Mark Kennard.
Pending U.S. Appl. No. 11/146,572 entitled: Laminated Layer Structure and Method for Forming the Same, filed Jun. 6, 2005 by Christophe Figuet.
Perego et al, "Fabrication of $GeO_2$ layers using a divalent Ge precursor," Applied Physics Letters 90, 2007.
Presting et al., "Buffer Concepts of Ultrathin Simgen Superlattices" Thin Solid Films, Elsevier-Sequoia S.A. Lausanne, CH, vol. 222, No. 1/2, Dec. 20, 1992 (Dec. 20, 1992), pp. 215-220.
Reinking et al., "Ge p-MOSFETs compatible with Si CMOS-technology", *Proceedings of the 29th ESSDERC* 99:300-303 (1999).
Samavedam et al., "High-quality germanium photodiodes integrated on silicon substrates using optimized relaxed graded buffers", *Applied Physics Letters* 73:2125-2127 (1998).
Schöllhorn et al., "Coalescence of germanium islands on silicon", *Thin Solid Films* 336:109-111 (1998).
Shang et al., "Electrical characterization of germanium p-channel MOSFETs", *IEEE Electron Device Letters* 24:242-244 (2003).
Singapore Search Report dated Jun. 16, 2009, received in Singapore Application No. 200809179-5, filed Jun. 27, 2007.
Singapore Written Opinion dated Jun. 16, 2009, received in Singapore Application No. 200809179-5, filed Jun. 27, 2007.
Sugii et al., "SiGe-on-Insulator Substrate Fabricated by Melt Solidification for a Strained-Silicon Complementary Metal-Oxide-Semiconductor", J. Vac. Sci. Technol. B20(5):1891-1896 (2002).
Sugiyama et al., "Formation of Strained-Silicon Layer on Thin Relaxed-SiGe/$SiO_2$/Si Structure Using SIMOX Technology", Thin Solid Films 369:199-202 (2000).
Taiwanese Office Action dated Apr. 30, 2010 for Taiwanese Patent Application No. 093106618.
Teichert et al., "Interplay of Dislocation Network and Island Arrangement in SiGe Films Grown on Si(001)", Thin Solid Films 380:25-28 (2000).
Thomas et al., "Structural characterization of thick, high-quality epitaxial Ge on Si substrates grown by low-energy plasma-enhanced chemical vapor deposition", *Journal of Electronic Materials* 32:976-980 (2003).
Trinkaus et al., "Strain Relaxation Mechanism for Hydrogen-Implanted $Si_{1-x}Ge_x$/Si(100) Heterostructures", Applied Physics Letters 76:3552-3554 (2000).
Vescan et al., "Relaxation Mechanism of Low Temperature SiGe—Si(100) Buffer Layers", ICSI3, p. 141 (Mar. 2003).
Wolf, "Silicon Processing for the VLSI Era", vol. 1: Process Technology, pp. 198 & 519-520 (1986).
Yamamoto et al., "Dislocation Structures and Strain-Relaxation in SiGe Buffer Layers on Si (0 0 1) Substrates with an Ultra-Thin Ge Interlayer," *Appl. Surface Sci.* 224: 108-112 (2004).

(56) References Cited

OTHER PUBLICATIONS

International Search Report and Written Opinion dated Feb. 6, 2015 in Application No. PCT/US2014/068387.

* cited by examiner

CYCLICAL DEPOSITION OF GERMANIUM

CROSS-REFERENCE TO RELATED APPLICATIONS

The present application is a continuation of U.S. application Ser. No. 14/969,413, filed Dec. 15, 2015, which is a continuation of U.S. application Ser. No. 14/135,383, filed Dec. 19, 2013, issued as U.S. Pat. No. 9,218,963, each of which is incorporated herein by reference in its entirety.

BACKGROUND OF THE INVENTION

Field of the Invention

The application relates to deposition processes for forming germanium films.

Background

Germanium thin films are used in a variety of contexts, particularly in the semiconductor industry. For example, Ge devices are of interest because of Ge high hole mobility. Low $D_{it}$ interface formation with $HfO_2$ high-k material will allow for good Ge based FinFETs. Germanium films may also be used for epitaxial layers, sacrificial layers and for the formation of germanides. In many situations, the films are deposited on high aspect ratio structures, such as in the formation of FinFETs, Deposition of relatively pure germanium at relatively low temperatures by highly conformal processes has heretofore been difficult.

SUMMARY

In some aspects, methods for forming a germanium thin film using a cyclical deposition process are provided. In some embodiments, the germanium thin film is formed on a substrate in a reaction chamber, and the process includes one or more deposition cycles of alternately and sequentially contacting the substrate with a vapor phase germanium precursor and a nitrogen reactant. In some embodiments, the process is repeated until a germanium thin film of desired thickness has been formed.

According to some embodiments, after contacting the substrate with a vapor phase germanium precursor, the substrate is exposed to a purge gas and/or a vacuum to remove excess germanium precursor and reaction byproducts from the substrate surface, if any. In some embodiments, after contacting the substrate with a vapor phase nitrogen reactant, the substrate is exposed to a purge gas and/or a vacuum to remove excess nitrogen reactant and reaction byproducts from the substrate surface, if any.

According to some embodiments, the germanium reactant at least partially decomposes in each deposition cycle. In some embodiments, the process is performed at a temperature below the temperature at which the germanium precursor decomposes without the presence of another precursor. In some embodiments, the process is performed at a temperature below about 600° C. In some embodiments, the process is performed at a temperature below about 500° C.

According to some embodiments, the germanium film is an elemental germanium film. In some embodiments, the germanium film comprises less than about 5 at-% impurities. In some embodiments, the germanium thin film contains less than about 3 at-% oxygen. The process of claim 1, wherein the growth rate is greater than about 2 angstroms/cycle.

According to some embodiments, the nitrogen reactant comprises ammonia, elemental nitrogen, nitrogen plasma, or nitrogen radicals. In some embodiments, the Ge-precursor is a germanium alkoxide or alkylamine. In some embodiments, the germanium precursor is not a germane. In some embodiments, the germanium precursor is $Ge(OCH_2CH_3)_4$.

In some aspects, methods for forming a germanium thin film using a cyclical deposition process are provided, in which the cyclical process includes continuously flowing a nitrogen reactant through the reaction chamber, contacting the substrate with a vapor phase Ge precursor, removing excess Ge precursor and reaction by products, if any, from the reaction space by ceasing to provide Ge precursor to the reaction chamber, and repeating the contacting and removing steps until a germanium thin film of the desired thickness has been formed. In some embodiments, the concentration of the nitrogen reactant is kept low enough to suppress any gas-phase reaction between the nitrogen reactant and the Ge precursor.

In some aspects, methods for forming a germanium thin film using a cyclical deposition process are provided, in which at least one of the deposition cycles includes contacting the substrate with a first vapor phase germanium precursor, exposing the substrate to a purge gas and/or a vacuum to remove excess germanium precursor and reaction by-products from the substrate surface, if any, contacting the substrate with a second vapor phase reactant, exposing the substrate to a purge gas and/or a vacuum to remove excess nitrogen reactant and reaction by-products from the substrate surface, if any, and repeating the contacting and removing steps until a germanium thin film of the desired thickness has been formed. In some embodiments, the second reactant does not comprise $H_2$ or $H_2$-based plasma species. In some embodiments, the germanium thin film comprises elemental germanium with less than 5% impurities.

BRIEF DESCRIPTION OF THE DRAWINGS

Various embodiments will be better understood from the appended drawings, which are meant to illustrate and not to limit the invention, and wherein.

DETAILED DESCRIPTION OF PREFERRED EMBODIMENTS

Figure 1:
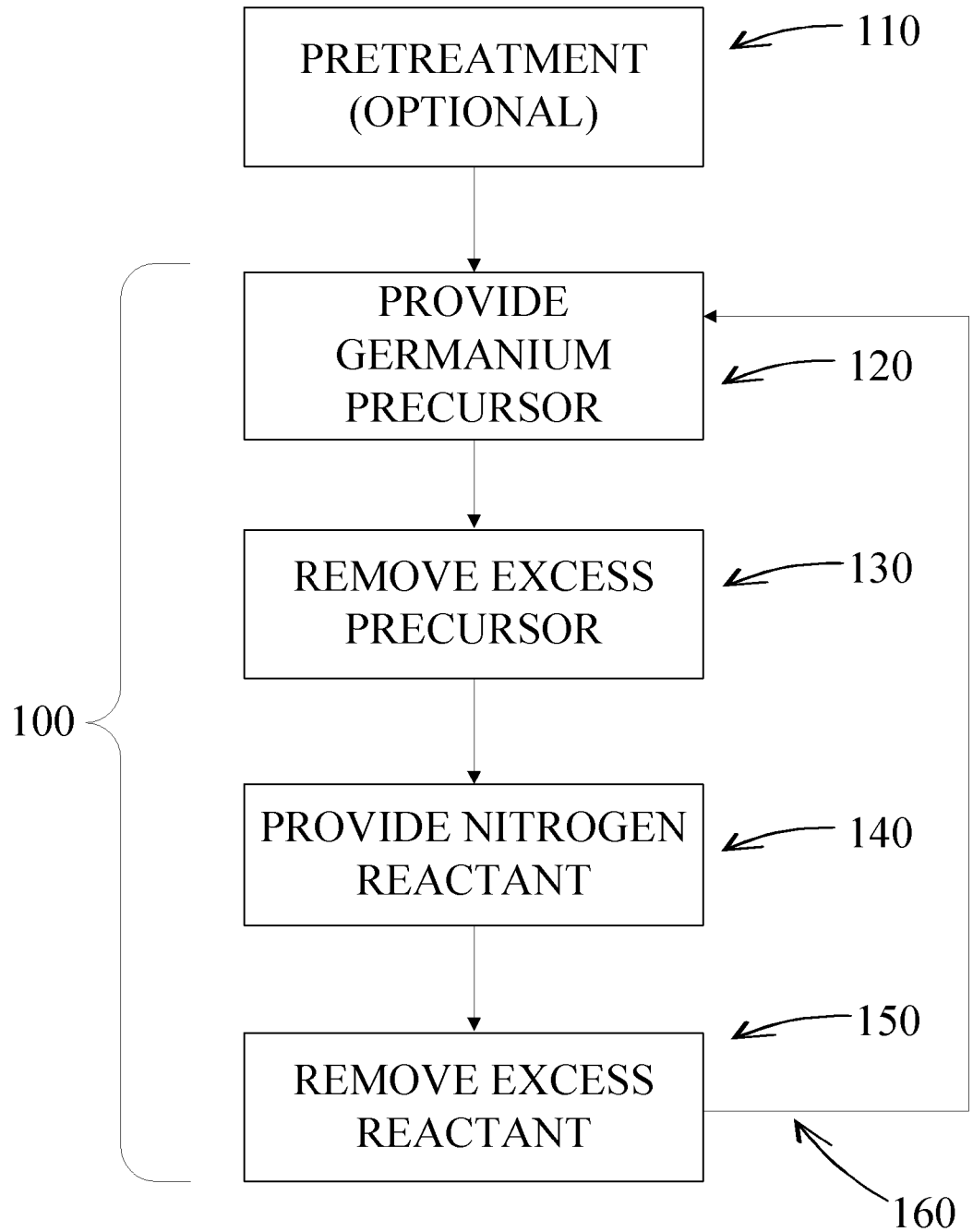
FIG. 1 illustrates an exemplary cyclical germanium deposition process according to some embodiments of the present disclosure.

In one aspect, methods of depositing germanium thin films by a cyclical deposition process are provided. In some embodiments a germanium thin film is formed on a substrate by a vapor deposition process comprising one or more deposition cycles in which a substrate is alternately and sequentially contacted with a vapor phase germanium precursor and a vapor phase reducing agent, typically a nitrogen reactant. In the first part of the deposition cycle, a layer of the germanium precursor forms on the substrate surface. In the second part of the deposition cycle, the nitrogen reactant subsequently reacts with the germanium precursor to form a germanium thin film.

In some embodiments the vapor deposition process is an atomic layer deposition process and the germanium precursor does not decompose. However, in some embodiments the germanium precursor at least partially decomposes during the deposition process.

In some embodiments a relatively pure germanium film is deposited by a cyclical deposition process. For example, the germanium film may be at least 90%, 95%, 97%, 98% or 99% pure germanium in some embodiments.

In some embodiments the germanium precursor may be an alkoxide. For example, in some embodiments the germanium precursor is selected from germanium ethoxide (GeOEt)$_4$ and tetrakis(dimethylamino) germanium (TDMAGe). Other possible germanium precursors are provided below and may include germanium compounds containing Ge—O bonds, Ge—C bonds (for example, germanium alkyls), or Ge—N bonds (for example, germanium alkylamines). In some embodiments the germanium precursor is not a halide. In some embodiments, the Ge precursor contains a halide in at least one ligand, but not in all ligands. According to some embodiments, the germanium precursor does not include only germanium and hydrogen. For example, in some embodiments the germanium precursor is not a germane (GeH$_x$).

In some embodiments the nitrogen reactant comprises compounds containing N—H bonds, such as NH$_3$, nitrogen-containing plasma, atomic nitrogen, and/or nitrogen radicals In some embodiments, germanium thin films are deposited by alternately and sequentially contacting a substrate with Ge(OCH$_2$CH$_3$)$_4$ and NH$_3$. In some embodiments germanium thin films are deposited by alternately and sequentially contacting a substrate with tetrakis(dimethylamino) germanium (TDMAGe) and NH$_3$.

Germanium films may be used in a variety of different contexts. For example in some embodiments a germanium film may serve as an epitaxial layer. In some embodiments a germanium film does not serve as an epitaxial or single-crystal layer. In some embodiments a germanium film may serve as a sacrificial layer. In some embodiments a germanium layer may be used for the formation of a germanide. In some embodiments, a germanium layer may be used in a germanium condensation process. In some embodiments a germanium layer may be deposited on a high aspect ratio structure, such as a FinFET structure. Other contexts in which germanium thin films may be utilized will be apparent to the skilled artisan. For example, germanium thin films may find use in optical applications. In some embodiments, the germanium films are annealed after the deposition as desired depending on the application.

The cyclical deposition processes disclosed herein allow for conformal deposition of germanium films. In some embodiments, the germanium films deposited have at least 50%, 80%, 90%, 95% or higher conformality. In some embodiments the films are about 100% conformal.

The substrate may be, for example, a semiconductor substrate. In some embodiments the substrate surface is H-terminated.

The substrate may be treated prior to depositing the germanium layer. For example, the substrate may be treated with a passivation chemical to prevent oxidation during air exposure prior to depositing germanium. In other embodiments the substrate is treated to form an interfacial layer prior to depositing germanium.

In some embodiments, following germanium deposition, a further film is deposited. The additional film may be directly over and contacting the germanium layer. In some embodiments a metal film is deposited over the germanium film, for example for forming a metal germanide. Nickel may be deposited over a germanium layer and subsequently annealed to form a nickel germanide. In some embodiments a high-k film is deposited after the germanium is deposited.

The high-k layer or other film may be deposited by ALD or by other known deposition methods. In some embodiments, a HfO$_2$ layer is deposited over the germanium layer. In some embodiments an Al$_2$O$_3$ layer is deposited over the germanium layer. In some embodiments, a deposition process for a film deposited on top of a germanium film uses water as an oxygen source. In some embodiments, a deposition process for a film deposited on top of a germanium film uses ozone as an oxygen source, In some embodiments a deposition process for a film deposited on top of a germanium film uses oxygen atoms, oxygen radicals or oxygen containing plasma as an oxygen source.

Cyclical Deposition Process

As noted above, processes described herein enable use of cyclical layer deposition techniques to deposit conformal germanium layers. The cyclical deposition process is mostly surface-controlled (based on controlled reactions at the substrate surface) and thus has the advantage of providing high conformality at relatively low temperatures. However, in some embodiments, the germanium, precursor may at least partially decompose. Accordingly, in some embodiments the cyclical process described herein is a pure ALD process in which no decomposition of precursors is observed. In other embodiments, reaction conditions, such as reaction temperature, are selected such that at least some decomposition takes place.

Cyclical deposition processes are based on alternatingly providing vapor phase reactants to a reaction space to interact with a substrate surface contained therein. Gas phase reactions are avoided by feeding the precursors alternately and sequentially into the reaction chamber. Vapor phase reactants may be separated from each other in the reaction chamber, for example, by removing excess reactants and/or reactant by-products from the reaction chamber between reactant pulses. Removal may occur through the use of a purge gas and/or an applied vacuum.

Briefly, a substrate is loaded into a reaction chamber and is heated to a suitable deposition temperature, generally at lowered pressure. Deposition temperatures may be maintained above the temperature at which the germanium precursor does not decompose in the presence of another reactant and below the germanium precursor's thermal decomposition temperature. The temperature should also be at a high enough level to provide the activation energy for the desired surface reactions. Because of the variability in decomposition temperatures of different compounds, the actual reaction temperature in any given embodiment may be selected based on the specifically chosen precursors. In some embodiments the deposition temperature is below about 600° C. In some embodiments, the deposition temperature is below about 500° C. In some embodiments the deposition temperature is below about 450° C. In some embodiments the deposition temperature is preferably below about 400° C. and even, in some cases, below about 375° C., A first germanium reactant is conducted into the chamber in the form of vapor phase pulse and contacted with the surface of a substrate. In some embodiments the substrate surface comprises a three dimensional structure. In some embodiments, conditions are preferably selected such that more than about one monolayer of the germanium precursor is adsorbed. Excess first reactant and reaction byproducts, if any, may be removed from the substrate and substrate surface and from proximity to the substrate and substrate surface. In some embodiments reactant and reaction byproducts, if any, may be removed by purging. Purging may be accomplished, for example, with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 seconds to about 20 seconds, more preferably between about 1 second and about 10 seconds, and still more preferably between about 1 second and about 2 seconds. However, other purge times can be utilized if necessary, such as when depositing layers over extremely high aspect ratio structures or other structures with complex surface morphology. The appropriate purge times can be readily determined by the skilled artisan based on the particular circumstances.

Another method for removing excess reactants—metal precursors or nitrogen reactants, reaction byproducts, etc.—from the substrate surface or from the area of the substrate may involve physically moving the substrate from a location containing the reactant and/or reaction byproducts.

A second gaseous reactant is pulsed into the chamber where it reacts with the first germanium reactant on the surface to form essentially pure germanium. The second reactant is a reducing agent that removes ligands from the first reactant on the substrate surface. In some embodiments the second reactant is a nitrogen reactant. Excess second reactant and gaseous by-products of the surface reaction are removed from the substrate, for example by purging them out of the reaction chamber, preferably with the aid of an inert gas. The steps of pulsing and removing are repeated until a thin film of germanium of the desired thickness has been formed on the substrate, with each cycle typically leaving more than about a molecular monolayer.

As mentioned above, in some embodiments each pulse or phase of each cycle may be self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. In some arrangements, the degree of self-limiting behavior can be adjusted by adjusting the reaction temperature to allow for some decomposition of the germanium reactant in combination with the nitrogen reactant.

In some embodiments the second nitrogen reactant can be provided continuously throughout the deposition process. Thus, in some embodiments a nitrogen reactant is flowed continuously throughout the deposition process and a germanium precursor is provided at regular intervals. In some embodiments nitrogen reactant is flowed continuously at a low concentration. The concentration is kept low enough to prevent gas-phase reactions between the germanium precursor and the nitrogen reactant thereby maintaining the surface-controlled nature of the process.

In some embodiments, a reaction space can be in a single-wafer reactor or a batch reactor where deposition on multiple substrates takes place at the same time. In some embodiments the substrate on which deposition is desired, such as a semiconductor workpiece, is loaded into a reactor. The reactor may be part of a cluster tool in which a variety of different processes in the formation of an integrated circuit are carried out. In some embodiments a flow-type reactor is utilized. In some embodiments a high-volume manufacturing-capable single wafer reactor is used. In other embodiments a batch reactor comprising multiple substrates is used. For embodiments in which batch reactors are used, the number of substrates may be in the range of 10 to 200, in the range of 50 to 150, or in the range of 100 to 130.

According to some embodiments, a showerhead reactor may be used.

Examples of suitable reactors that may be used include commercially available equipment such as the F-120® reactor, F-450® reactor, Pulsar® reactors—such as the Pulsar® 2000 and the Pulsar® 3000—EmerALD® reactor and Advance® 400 Series reactors, available from ASM America, Inc of Phoenix, Ariz. and ASM Europe B.V., Almere, Netherlands. Other commercially available reactors include those from ASM Japan K,K (Tokyo, Japan) under the tradename Eagle® XP and XP8. In addition to these reactors, many other kinds of reactors capable of growth of thin films, including CVD reactors equipped with appropriate equipment and means for pulsing the precursors can be employed.

Suitable batch reactors include, but are not limited to, reactors commercially available from and ASM Europe B.V (Almere, Netherlands) under the trade names ALDA400™ and A412™. In some embodiments a vertical batch reactor is utilized in which the boat rotates during processing, such as the A412™. Thus, in some embodiments the wafers rotate during processing. In some embodiments in which a batch reactor is used, wafer-to-wafer uniformity is less than 3% (1sigma), less than 2%, less than 1% or even less than 0.5%.

The cyclical germanium processes described herein can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run.

Referring to FIG. 1, and according to some embodiments, a germanium thin film is formed by a cyclical deposition process 100 comprising multiple pulsing cycles, each cycle comprising:

providing a pulse of a vaporized first Ge precursor into the reaction chamber at step 120 to contact the substrate surface with the Ge precursor;

removing excess Ge precursor and reaction by products, if any, at step 130;

providing a pulse of a second nitrogen reactant into the reaction chamber at step 140, removing at step 150 excess second reactant and any gaseous by-products formed in the reaction between the Ge precursor layer on the first surface of the substrate and the second reactant, and repeating at step 160 the pulsing and removing steps until a germanium thin film of the desired thickness has been formed.

As mentioned above, in some embodiments the substrate may be pretreated prior to beginning the deposition process 100. In FIG. 1 this is indicated by step 110 in which the substrate is optionally subjected to a pretreatment process.

When the Ge precursor contacts the substrate, the Ge precursor may form at least a monolayer, less than a monolayer, or more than a monolayer.

In some embodiments, a carrier gas is flowed continuously to the reaction space throughout the deposition process. In each deposition cycle the first germanium precursor is pulsed into the reaction chamber. Excess germanium precursor is then removed from the reaction chamber. In some embodiments, the carrier gas comprises nitrogen. In some embodiments a separate purge gas is utilized.

The Ge precursor employed in the cyclical processes may be solid, liquid, or gaseous material under standard conditions (room temperature and atmospheric pressure), provided that the Ge precursor is in vapor phase before it is conducted into the reaction chamber and contacted with the substrate surface.

"Pulsing" a vaporized reactant into the reaction chamber means that the precursor vapor is conducted into the chamber for a limited period of time. Typically, the pulsing time is from about 0.05 seconds to about 10 seconds. However, depending on the particular circumstances, including for example the substrate type and its surface area, the pulsing time may be even higher than about 10 seconds.

In some embodiments, for example for a 300 mm wafer in a single wafer reactor, the Ge precursor is pulsed for from about 0.05 seconds to about 10 seconds, for from about 0.1 seconds to about 5 seconds or from about 0.3 seconds to about 3.0 seconds.

The nitrogen reactant may be pulsed for from about 0.05 seconds to about 10 seconds, from about 0.1 seconds to about 5 seconds, or for from about 0.2 seconds to about 3.0 seconds. However, pulsing times for one or both reactants can be on the order of minutes in some cases. The optimum pulsing time for each reactant can be determined by the skilled artisan based on the particular circumstances.

As mentioned above, in some embodiments the Ge precursor is a germanium alkoxide, for example $Ge(OEt)_4$ or $Ge(OMe)_4$. In some embodiments, the Ge precursor is TDMAGe. In some embodiments, the Ge precursor includes alkyl and/or alkylamine groups. In some embodiments the Ge-precursor is not a halide. In some embodiments the Ge-precursor may comprise a halogen in at least one ligand, but not in all ligands. The germanium precursor may be provided with the aid of an inert carrier gas, such as argon.

In some embodiments the nitrogen reactant comprises a nitrogen-hydrogen bond. In some embodiments the nitrogen reactant is ammonia ($NH_3$). In some embodiments, the nitrogen reactant is molecular nitrogen. In some embodiments the nitrogen reactant is a nitrogen containing plasma. In some embodiments, the nitrogen source comprises an activated or excited nitrogen species. The nitrogen reactant may be a provided in a nitrogen-containing gas pulse that can be a mixture of nitrogen reactant and inactive gas, such as argon.

In some embodiments, a nitrogen-containing plasma is formed in the reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of remote plasma, the pathway to the substrate can be optimized to maximize electrically neutral species and minimize ion survival before reaching the substrate.

Irrespective of the nitrogen reactant used, in some embodiments of the present disclosure, the use of a nitrogen reactant does not contribute significant amounts of nitrogen to the deposited film. According to some embodiments, the resulting germanium film contains less than about 5-at %, less than about 2-at % or even less than about 1-at % nitrogen. In some embodiments, the nitrogen content of the germanium film is less than about 0.5-at % or even less than about 0.2-at %.

In some embodiments hydrogen reactants are not used in the deposition process. In some embodiments, elemental hydrogen ($H_2$) is not provided in at least one deposition cycle, or in the entire deposition process. In some embodiments, hydrogen plasma is not provided in at least one deposition cycle or in the entire deposition process. In some embodiments, hydrogen atoms or radicals are not provided in at least one deposition cycle, or in the entire deposition process.

In some embodiments the Ge precursor comprises at least one amine or alkylamine ligand, such as those presented in formulas (2) through (6) and (8) and (9), and the nitrogen reactant comprises $NH_3$.

Before starting the deposition of the film, the substrate is typically heated to a suitable growth temperature, as discussed above. The preferred deposition temperature may vary depending on a number of factors such as, and without limitation, the reactant precursors, the pressure, flow rate, the arrangement of the reactor, and the composition of the substrate including the nature of the material to be deposited on. In some embodiments the deposition temperature is selected to be between the temperature where the germanium precursor does not decompose without the second nitrogen precursor, at the lower end, and the temperature where the precursor does decompose by itself, at the upper end. As discussed elsewhere, in some embodiments the temperature may be less than about 600° C., less than about 450° C., less than about 400° C., and in some cases, less than about 375° C. In some embodiments using $Ge(OCH_2CH_3)_4$ and $NH_3$ as the germanium and nitrogen reactants, the temperature is about 350° C.

The processing time depends on the thickness of the layer to be produced and the growth rate of the film. In ALD, the growth rate of a thin film is determined as thickness increase per one cycle. One cycle consists of the pulsing and removing steps of the precursors and the duration of one cycle is typically between about 0.2 seconds and about 30 seconds, more preferably between about 1 .second and about 10 seconds, but it can be on order of minutes or more in some cases, for example, where large surface areas and volumes are present.

In some embodiments the growth rate of the germanium thin films may be greater than or equal to about 2 Å/cycle, greater than or equal to about 5 Å/cycle, greater than or equal to about 10 Å/cycle, and, in some embodiments, even greater than about 15 Å/cycle.

In some embodiments the germanium film formed is a relatively pure germanium film. Preferably, aside from minor impurities no other metal or semi-metal elements are present in the film. In some embodiments the film comprises less than 1-at % of metal or semi-metal other than Ge. In some embodiments, the germanium film comprises less than about 5-at % of any impurity other than hydrogen, preferably less than about 3-at % of any impurity other than hydrogen, and more preferably less than about 1-at % of any impurity other than hydrogen. In some embodiments a germanium film comprises less than about 5 at-% nitrogen, less than about 3 at-% nitrogen less than about 2 at-% nitrogen or even less than about 1 at-% nitrogen. In some embodiments, a pure germanium film comprises less than about 2-at % oxygen, preferably less than about 1-at % or less than about 0.5-at % and even less than about 0.25-at %.

In some embodiments a germanium precursor comprising oxygen is utilized and the germanium film comprises no oxygen or a small amount of oxygen as an impurity. In some embodiments the germanium film deposited using a germanium precursor comprising oxygen may comprise less than about 2 at-% oxygen, less than about 1 at-%, less than about 0.5 at-% or even less than about 0.25 at-%.

In some embodiments, the germanium film formed has step coverage of more than about 50%, more than about 80%, more than about 90%, or even more than about 95% on structures which have high aspect ratios. In some embodiments high aspect ratio structures have an aspect ratio that is more than about 3:1 when comparing the depth or height to the width of the feature. In some embodiments the structures have an aspect ratio of more than about 5:1, or even an aspect ratio of 10:1 or greater.

Ge Precursors

A number of different Ge precursors can be used in the cyclical processes. In some embodiments the Ge precursor is tetravalent (i.e. Ge has an oxidation state of +IV). In some embodiments, the Ge precursor is not divalent (i.e., Ge has an oxidation state of +II). In some embodiments, the Ge precursor may comprise at least one alkoxide ligand. In some embodiments, the Ge precursor may comprise at least one amine or alkylamine ligand. In some embodiments the Ge precursor is a metal-organic or organometallic compound. In some embodiments the Ge precursor comprises at least one halide ligand. In some embodiments the Ge precursor does not comprise a halide ligand.

In some embodiments the Ge precursor comprises a Ge—O bond. In some embodiments the Ge precursor comprises a Ge—N bond. In some embodiments the Ge precursor comprises a Ge—C bond. In some embodiments the Ge precursor does not comprise Ge—H bond. In some embodiments the Ge precursor comprises equal or less than two Ge—H bonds per one Ge atom.

In some embodiments the Ge precursor is not solid at room temperature (e.g., about 20° C.).

For example, Ge precursors from formulas (1) through (9) below may be used in some embodiments.

$$GeOR_4 \tag{1}$$

Wherein R is can be independently selected from the group consisting of alkyl and substituted alkyl;

$$GeR_xA_{4-x} \tag{2}$$

Wherein the x is an integer from 1 to 4;
R is an organic ligand and can be independently selected from the group consisting of alkoxides, alkylsilyls, alkyl, substituted alkyl, alkylamines; and
A can be independently selected from the group consisting of alkyl, substituted alkyl, alkoxides, alkylsilyls, alkyl, alkylamines, halide, and hydrogen.

$$Ge(OR)_xA_{4-x} \tag{3}$$

Wherein the x is an integer from 1 to 4;
R can be independently selected from the group consisting of alkyl and substituted alkyl; and
A can be independently selected from the group consisting of alkyl, alkoxides, alkylsilyls, alkyl, substituted alkyl, alkylamines, halide, and hydrogen.

$$Ge(NR^IR^{II})_4 \tag{4}$$

Wherein $R^I$ can be independently selected from the group consisting of hydrogen, alkyl and substituted alkyl; and
$R^{II}$ can be independently selected from the group consisting of alkyl and substituted alkyl;

$$Ge(NR^IR^{II})_xA_{4-x} \tag{5}$$

Wherein the x is an integer from 1 to 4;
$R^I$ can be independently selected from the group consisting of hydrogen, alkyl and substituted alkyl; and
$R^{II}$ can be independently selected from the group consisting of alkyl and substituted alkyl;
A can be independently selected from the group consisting of alkyl, alkoxides, alkylsilyls, alkyl, substituted alkyl, alkylamines, halide, and hydrogen.

$$Ge_n(NR^IR^{II})_{2n+2} \tag{6}$$

Wherein the n is an integer from 1 to 3;
$R^I$ can be independently selected from the group consisting of hydrogen, alkyl and substituted alkyl; and
$R^{II}$ can be independently selected from the group consisting of alkyl and substituted alkyl;

$$Ge_n(OR)_{2n+2}$$

Wherein the n is an integer from 1 to 3; and
Wherein R can be independently selected from the group consisting of alkyl and substituted alkyl;

$$Ge_nR_{2n+2} \tag{8}$$

Wherein the n is an integer from 1 to 3; and
R is an organic ligand and can be independently selected from the group consisting of alkoxides, alkylsilyls, alkyl, substituted alkyl, alkylamines.

$$A_{3-x}R_xGe\text{—}GeR_yA_{3-y} \tag{9}$$

Wherein the x is an integer from 1 to 3;
y is an integer from 1 to 3;
R is an organic ligand and can be independently selected from the group consisting of alkoxides, alkylsilyls, alkyl, substituted alkyl, alkylamines; and
A can be independently selected from the group consisting of alkyl, alkoxides, alkylsilyls, alkyl, substituted alkyl, alkylamines, halide and hydrogen.

Preferred options for R include, but are not limited to, methyl, ethyl, propyl, isopropyl, n-butyl, isobutyl, tertbutyl for all formulas, more preferred in ethyl and methyl. In some embodiments, the preferred options for R include, but are not limited to, $C_3$-$C_{10}$ alkyls, alkenyls, and alkynyls and substituted versions of those, more preferably $C_3$-$C_6$ alkyls, alkenyls, and alkenyls and substituted versions of those.

In some embodiments the Ge precursor comprises one or more halides. For example, the precursor may comprise 1, 2, or 3 halide ligands. However, as mentioned above, in some embodiments the Ge precursor does not comprise a halide.

In some embodiments a germane ($GeH_x$) is not used.

In some embodiments alkoxide Ge precursors may be used, including, but not limited to, one or more of $Ge(OMe)_4$, $Ge(OEt)_4$, $Ge(O^iPr)_4$, $Ge(O^nPr)_4$ and $Ge(O^tBu)_4$. In some embodiments the Ge precursor is TDMAGe. In some embodiments the Ge precursor is TDEAGe. In some embodiments the Ge precursor is TEMAGe.

EXAMPLES

The ability to deposit germanium films by decomposing germanium precursors at relatively low temperatures was tested. At temperatures of about 375° C. and about 400° C., no germanium films were seen when only alternating Ge precursor pulses and carrier gas purges without second reactant. In these decomposition tests, $Ge(OEt)_4$ was used as the germanium precursor and was kept at room temperature. The $Ge(OEt)_4$ was cyclically pulsed through the reaction space for 3 seconds followed by a 6 second purge.

However, by utilizing a cyclical deposition process in which the substrate was alternately contacted with a germanium precursor and a nitrogen reactant, deposition was observed in the temperature range of about 350° C. to about 400° C.

In one set of experiments, germanium films were deposited in an F-450® reactor at 350° C. by repeating a deposition cycle comprising alternate and sequential pulses of $Ge(OEt)_4$ and $NH_3$. The $Ge(OEt)_4$ was kept at room temperature. The $NH_3$ was flowed through the reaction space at 100 sccm. Each cycle comprised a 3 seconds germanium precursor pulse, a 6 second purge, and a 3 second nitrogen reactant pulse followed by a 10 second purge. A thick metal-like film of greater than 80 nm was formed with 2000 cycles.

Germanium films were also deposited in an Pulsar® 2000 reactor at temperatures ranging from about 365° C. to about 400° C. using germanium ethoxide (Ge(OEt)$_4$) as the Ge precursor, and ammonia (NH$_3$) as the nitrogen reactant. Ge(OEt)$_4$ is a liquid with a vapor pressure of about 0.2 Torr at 55° C. The Ge(OEt)$_4$ was kept at room temperature. The NH$_3$ was flowed through the reaction space at 100 sccm. Each cycle comprised a 3 seconds germanium precursor pulse, a 5 second purge, and a 3 second nitrogen reactant pulse followed by a 5 second purge. Each film was deposited using a cyclical process of 500 cycles. Composition was determined by Rutherford backscattering spectroscopy ("RBS"). The results are summarized in Table 1 below.

TABLE 1

Germanium films achieved with cyclical process.

| Sample | Deposition T (° C.) | Thickness (nm) | Atomic Concentration (at %) | | | |
|---|---|---|---|---|---|---|
| | | | Ge | O | C | N |
| 1 | 365 | 162 | 95.5 | 1.5 | 1.6 | 1.4 |
| 2 | 375 | 375 | 97.8 | 0.8 | 0.9 | 0.5 |
| 3 | 385 | 493 | 98.6 | 0.5 | 0.7 | 0.2 |
| 4 | 400 | 921 | 99.2 | 0.2 | 0.5 | 0.1 |

Figure 2A:
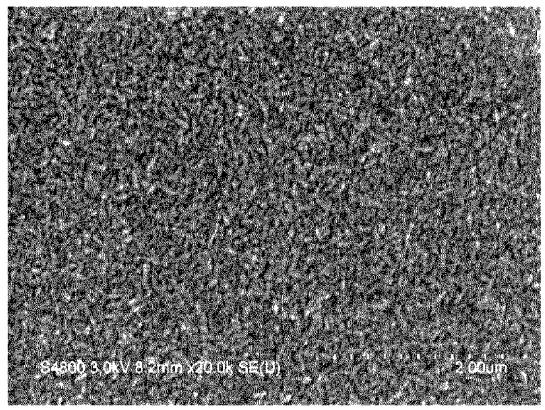
FIGS. 2A-D show images from a scanning electron microscope (SEM) of various germanium films deposited at different temperatures.
Figure 2B:
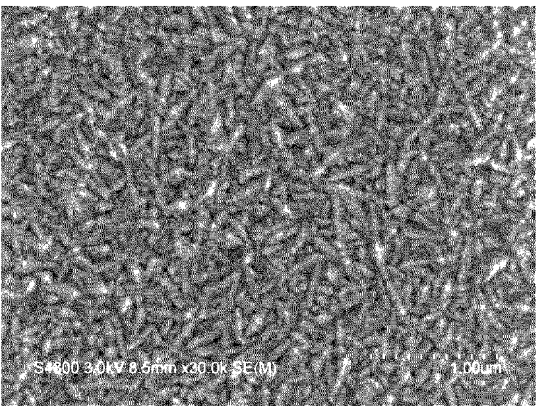
Figure 2C:
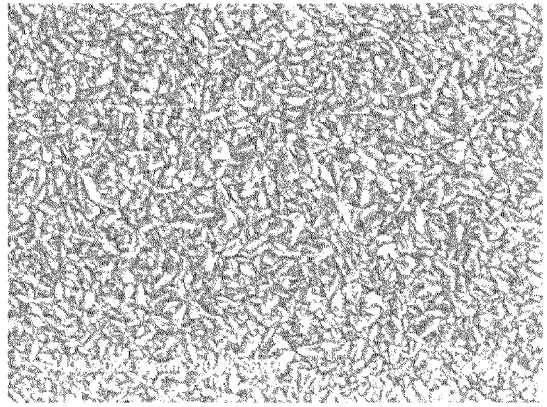
Figure 2D:
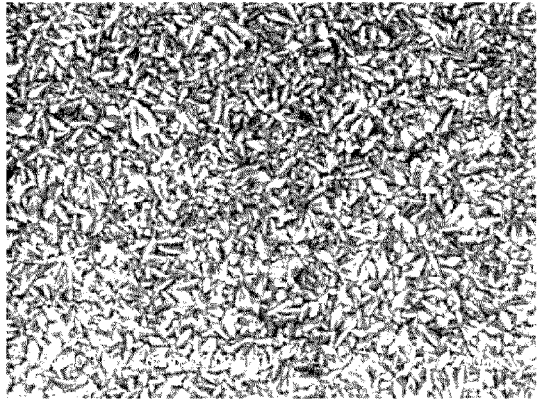

FIGS. 2A-D show SEM images of the four germanium films summarized in Table 1 above. Accordingly, FIG. 2A is an image of the film deposited at a temperature of about 365° C.; FIG. 2B is an image of the film deposited at a temperature of about 375° C.; FIG. 2C is an image of the film deposited at a temperature of about 385° C.; and FIG. 2D is an image of the film deposited at a temperature of about 400° C.

Figure 3A:
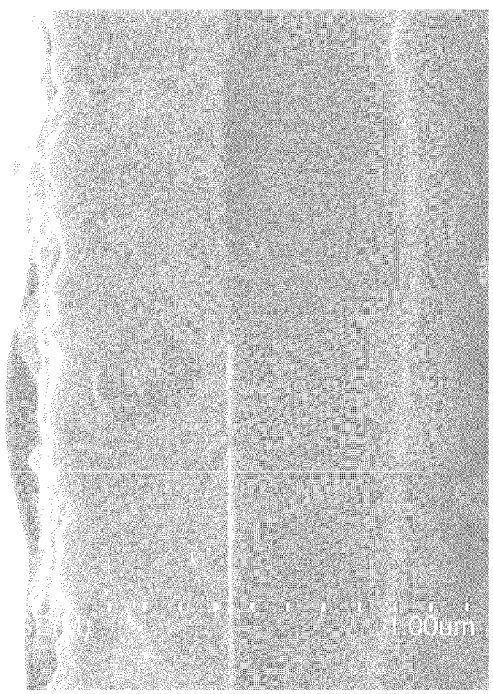
FIGS. 3A and 3B show SEM images of two germanium films deposited at 375° C. and 385° C., respectively.
Figure 3B:
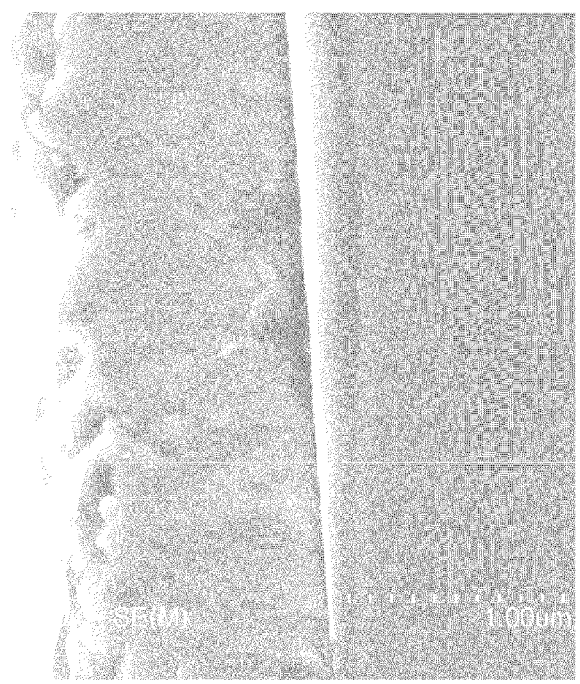

FIGS. 3A and 3B show SEM images of two of the germanium films summarized in Table 1. The image in FIG. 3A is of the film deposited at a reaction temperature of about 375° C., and the image in FIG. 3B is of the film deposited at a reaction temperature of about 385° C. Consistent with the data of Table 1, FIGS. 3A and 3B demonstrate that there is a temperature dependence for the growth rate, because the film deposited at about 385° C. is thicker than the film deposited at about 375° C. even though each film was formed using a cyclical process of 500 cycles.

The deposited germanium films exhibited a relatively high sheet resistance of about 4000-9000 Ω/sq.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. A process for forming an elemental germanium thin film on a substrate in a reaction chamber, the process comprising one or more deposition cycles comprising alternately and sequentially contacting the substrate with a vapor phase germanium precursor and a vapor phase nitrogen reactant, wherein the germanium precursor is not divalent.

2. The process of claim 1 further comprising, after contacting the substrate with the vapor phase germanium precursor, exposing the substrate to a purge gas and/or a vacuum to remove excess vapor phase germanium precursor from the substrate surface.

3. The process of claim 1 further comprising, after contacting the substrate with a vapor phase nitrogen reactant, exposing the substrate to a purge gas and/or a vacuum to remove excess nitrogen reactant from the substrate surface.

4. The process of claim 1, wherein the germanium reactant at least partially decomposes in each deposition cycle.

5. The process of claim 4, wherein the process is performed at a temperature below the temperature at which the germanium precursor decomposes in the absence of another precursor.

6. The process of claim 1, wherein the germanium thin film comprises less than about 5 at-% impurities.

7. The process of claim 1, wherein the nitrogen reactant comprises ammonia, elemental nitrogen, nitrogen plasma, or nitrogen radicals.

8. The process of claim 1, wherein the Ge-precursor is a germanium halide, germanium alkoxide or germanium alkylamine.

9. The process of claim 1, wherein the germanium precursor is tetravalent.

10. The process of claim 1, wherein the germanium precursor comprises a halogen in at least one ligand but not all ligands.

11. The process of claim 1, wherein the germanium precursor is not a germane.

12. The process of claim 1, wherein the germanium precursor is Ge(OCH$_2$CH$_3$)$_4$.

13. The process of claim 1, wherein the process is performed at a temperature below about 500° C.

14. A process for depositing an elemental germanium thin film on a substrate in a reaction chamber, the process comprising:
  continuously flowing a nitrogen reactant through the reaction chamber;
  contacting the substrate with a vapor phase germanium precursor, wherein the germanium precursor is tetravalent;
  removing excess vapor phase germanium precursor from the reaction chamber, and
  repeating the contacting and removing steps until an elemental germanium thin film of the desired thickness has been deposited on the substrate.

15. The process of claim 14, wherein the concentration of the nitrogen reactant is kept low enough to suppress any gas-phase reaction between the nitrogen reactant and the vapor phase germanium precursor.

16. The process of claim 14, wherein the germanium precursor comprises a germanium halide, a germanium alkoxide or a germanium alkylamine.

17. The method of claim 14, wherein removing comprises exposing the substrate to a purge gas.

18. A method for depositing an elemental germanium thin film on a substrate in a reaction chamber the method comprising:
  conducting a deposition cycle comprising, in order:
    contacting the substrate with a first vapor phase tetravalent germanium precursor;
    exposing the substrate to a purge gas and/or a vacuum;
    contacting the substrate with a second vapor phase nitrogen reactant; and
    exposing the substrate to a purge gas and/or a vacuum; and
  repeating the deposition cycle to form an elemental germanium thin film on the substrate, wherein the second reactant does not comprise $H_2$ or $H_2$-based plasma species, and wherein the elemental germanium thin film has less than 5% impurities.

19. The method of claim 18, wherein the germanium precursor is a germanium halide, germanium alkylamine or germanium alkoxide.

20. The process of claim 18, wherein the vapor phase germanium precursor is tetravalent.

* * * * *

UNITED STATES PATENT AND TRADEMARK OFFICE
CERTIFICATE OF CORRECTION

PATENT NO. : 9,929,009 B2
APPLICATION NO. : 15/435769
DATED : March 27, 2018
INVENTOR(S) : Raija H. Matero It is certified that error appears in the above-identified patent and that said Letters Patent is hereby corrected as shown below:

On the Title Page

In Column 1 (page 4, item (56)) at Line 41, under Other Publications, Change "Michael Shur" to --Shur, Michael--.

In the Specification

In Column 1 at Line 26, Change "FinFETs," to --FinFETs.--.

In Column 3 at Line 23, After "radicals" insert --.--.

In Column 4 at Line 9, Change "source," to --source.--.

In Column 4 at Line 20, Change "germanium," to --germanium--.

In Column 4 at Line 54, Change "C.," to --C.--.

In Column 6 at Line 10, Change "K,K" to --K.K--.

In Column 8 at Line 32, Change ".second" to --second--.

In Column 9 at Line 5, Change "greater," to --greater.--.

In Column 10 at Line 7 (approx.), After "$Ge_n(OR)_{2n+2}$" insert --(7)--.

In Column 10 at Line 26, Change "halide" to --halide,--.

In Column 11 at Line 1, Change "seem." to --sccm.--.

Signed and Sealed this
Twenty-sixth Day of June, 2018

Andrei Iancu
*Director of the United States Patent and Trademark Office*

CERTIFICATE OF CORRECTION (continued)
U.S. Pat. No. 9,929,009 B2

In the Claims

In Column 12 at Line 53, in Claim 17, Change "method" to --process--.

In Column 13 at Line 8, in Claim 20, Change "process" to --method--.